United States Patent
Salz et al.

(10) Patent No.: US 8,650,513 B2
(45) Date of Patent: Feb. 11, 2014

(54) REDUCING X-PESSIMISM IN GATE-LEVEL SIMULATION AND VERIFICATION

(75) Inventors: Arturo Salz, Menlo Park, CA (US); Guillermo R. Maturana, Berkeley, CA (US); In-Ho Moon, Portland, OR (US); Lisa R. McIlwain, Oregon City, OR (US)

(73) Assignee: Synopsys, Inc., Mountain View, CA (US)

(*) Notice: Subject to any disclaimer, the term of this patent is extended or adjusted under 35 U.S.C. 154(b) by 0 days.

(21) Appl. No.: 13/174,531

(22) Filed: Jun. 30, 2011

(65) Prior Publication Data

US 2012/0072876 A1    Mar. 22, 2012

Related U.S. Application Data

(60) Provisional application No. 61/384,507, filed on Sep. 20, 2010, provisional application No. 61/450,729, filed on Mar. 9, 2011, provisional application No. 61/437,483, filed on Jan. 28, 2011.

(51) Int. Cl.
   *G06F 17/50* (2006.01)
(52) U.S. Cl.
   USPC ............................................. 716/101
(58) Field of Classification Search
   USPC ..................................... 716/100, 101
   See application file for complete search history.

(56) References Cited

U.S. PATENT DOCUMENTS

| | | | |
|---|---|---|---|
| 6,301,553 B1* | 10/2001 | Burgun et al. | 703/15 |
| 6,718,523 B2* | 4/2004 | Hathaway et al. | 716/108 |
| 6,763,513 B1* | 7/2004 | Chang et al. | 716/114 |
| 7,225,418 B2* | 5/2007 | Shimazaki et al. | 716/113 |
| 2004/0249588 A1* | 12/2004 | Shimazaki et al. | 702/66 |
| 2005/0066297 A1* | 3/2005 | Kalafala et al. | 716/6 |
| 2006/0112359 A1* | 5/2006 | Becer et al. | 716/6 |
| 2007/0011527 A1* | 1/2007 | Goswami et al. | 714/726 |
| 2007/0033554 A1* | 2/2007 | Tsukiyama et al. | 716/4 |
| 2007/0136486 A1* | 6/2007 | Al Amri | 709/231 |
| 2009/0150844 A1* | 6/2009 | Iyengar et al. | 716/6 |
| 2009/0293028 A1* | 11/2009 | Hiraoglu et al. | 716/5 |
| 2010/0313175 A1* | 12/2010 | Petlin | 716/106 |
| 2011/0040548 A1* | 2/2011 | Khalily et al. | 703/14 |
| 2012/0005554 A1* | 1/2012 | Steiner et al. | 714/758 |
| 2012/0185810 A1* | 7/2012 | Borkam et al. | 716/108 |
| 2012/0239368 A1* | 9/2012 | Agmon | 703/13 |
| 2012/0278778 A1* | 11/2012 | Bhardwaj et al. | 716/113 |

* cited by examiner

*Primary Examiner* — Suchin Parihar
(74) *Attorney, Agent, or Firm* — Park, Vaughan, Fleming & Dowler LLP; Laxman Sahasrabuddhe

(57) ABSTRACT

Methods and apparatuses are described for reducing or eliminating X-pessimism in gate-level simulation and/or formal verification. A system can identify a set of reconvergent inputs of a combinational block in a gate-level design. Next, the system can determine whether or not the combinational block is expected to exhibit X-pessimism during gate-level simulation. If the combinational block is expected to exhibit X-pessimism during gate-level simulation, the system can modify the gate-level design to reduce X-pessimism during gate-level simulation. In some embodiments, the system can build a model for the gate-level design by using unique free input variables to represent sources of indeterminate values. The system can then use the model to perform formal verification.

32 Claims, 8 Drawing Sheets

RTL DESIGN 300

```
always @(posedge clk)
    if (c)
        q <= a;
    else
        q <= b;
```

GATE-LEVEL DESIGN 302

REDUCING X-PESSIMISM IN GATE-LEVEL SIMULATION AND VERIFICATION

RELATED APPLICATION

This application claims priority to U.S. Provisional Application No. 61/384,507, entitled "Gate-Level Simulation of X Values," by Arturo Salz, Guillermo Maturana, and In-Ho Moon, filed 20 Sep. 2010, the contents of which are herein incorporated by reference.

This application claims priority to U.S. Provisional Application No. 61/450,729, entitled "Method and Apparatus for Reducing X-Pessimism of a Gate-Level Simulation," by Arturo Salz, Guillermo Maturana, and In-Ho Moon, filed 9 Mar. 2011, the contents of which are herein incorporated by reference.

This application claims priority to U.S. Provisional Application No. 61/437,483, entitled "Hardware-Compliant Interpretation of 'X' in Logical Equivalence Checking for Gate-Level Circuits," by Lisa R. McIlwain, filed 28 Jan. 2011, the contents of which are herein incorporated by reference.

BACKGROUND

Technical Field

Rapid advances in computing technology have been made possible by sophisticated simulation and verification. Indeed, without such tools it would be almost impossible to verify complicated integrated circuits which are commonly found in today's computing devices.

In the early stages of an electronic design flow, a design is usually described at a high level of abstraction, and in later stages the design is described at progressively lower levels of abstraction. Simulations that are performed at a higher level of abstraction usually execute faster than simulations that are performed at lower levels of abstraction, because each event or operation at the higher level of abstraction maps to multiple events or operations at the lower level of abstraction. However, simulations at the lower level of abstraction are usually more accurate than the simulations at the higher level of abstraction because the simulations at the lower level of abstraction are more detailed than the simulations at the higher level of abstraction. Since it is usually impractical to simulate all possible behaviors of a circuit design, the circuit design may also be verified using logical equivalence checking.

It is generally desirable to ensure that a simulation and/or logical equivalence checking that is performed for a circuit design is consistent with one another and is consistent with the expected behavior of a chip that is manufactured based on the circuit design.

SUMMARY

Embodiments described in this disclosure provide methods and apparatuses for reducing or eliminating X-pessimism during gate-level simulation and/or formal verification.

Some embodiments, e.g., a simulation system, can identify a set of reconvergent inputs of a combinational block in a gate-level design. Next, the system can determine whether or not the combinational block is expected to exhibit X-pessimism during gate-level simulation. If the combinational block is expected to exhibit X-pessimism during gate-level simulation, the system can modify the gate-level design to reduce X-pessimism during gate-level simulation.

In some embodiments, the system can add a correcting block to the gate-level design, and select an output of the combinational block or the correcting block based on the values of one or more reconvergent inputs. Specifically, when the reconvergent input(s) to the combinational block are such that they would cause the combinational block to exhibit X-pessimism, the correcting block can output the corresponding non-X-pessimistic output value, e.g., the value that an actual circuit would produce.

In some embodiments, the system can replicate a combinational block that is expected to exhibit X-pessimism during gate-level simulation. Each input of interest that has an indeterminate value can be assigned a concrete value (e.g., a 0 or a 1) in each replica. Corresponding outputs from the replicas can be merged. Specifically, if the corresponding outputs from the replicas have the same value, then that value can be assigned to the output instead of assigning an indeterminate value to the output.

In some embodiments, the system can determine that the combinational block is expected to exhibit X-pessimism by simulating the combinational block with indeterminate values. In some embodiments, the system can receive user input which identifies one or more combinational blocks that are expected to exhibit X-pessimism. The user input may also identify a set of reconvergent inputs in each combinational block.

In some embodiments, the system can represent the combinational block using a Boolean expression, and analyze the Boolean expression to determine whether or not the combinational block is expected to exhibit X-pessimism during gate-level simulation.

Some embodiments, e.g., a verification system, can build a model for the gate-level design by using unique free input variables to represent sources of indeterminate values. The system can then use the model to perform formal verification, which may involve determining logical equivalency between two gate-level models and/or determining logical equivalency between a gate-level model and a corresponding register transfer level model.

In this disclosure, unless otherwise stated, the term "based on" means "based solely or partly on."

DETAILED DESCRIPTION

The following description is presented to enable any person skilled in the art to make and use the claimed embodiments, and is provided in the context of a particular application and its requirements. Various modifications to the disclosed embodiments will be readily apparent to those skilled in the art, and the general principles defined herein may be applied to other embodiments and embodiments. Thus, the claimed embodiments are to be accorded the widest scope consistent with the principles and features disclosed herein.

Figure 1:
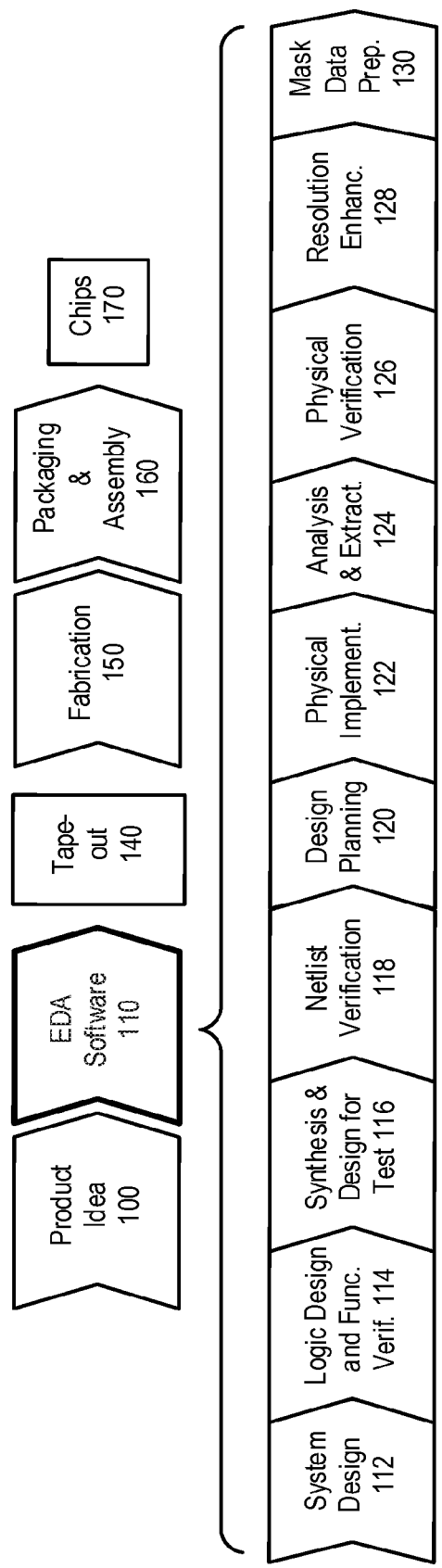
FIG. 1 illustrates various steps in the design and fabrication of an integrated circuit.

FIG. 1 illustrates various steps in the design and fabrication of an integrated circuit. The process starts with a product idea 100, which is realized using Electronic Design Automation (EDA) software 110. Chips 170 can be produced from the finalized design by performing fabrication 150 and packaging and assembly 160 steps.

A design flow that uses EDA software 110 is described below. Note that the design flow description is for illustration purposes only, and is not intended to limit the embodiments disclosed in this disclosure. For example, an actual integrated circuit design may require a designer to perform the design flow steps in a different sequence than the sequence described below.

In the system design step 112, the designers can describe the functionality to implement. They can also perform what-if planning to refine the functionality and to check costs. Further, hardware-software architecture partitioning can occur at this step. In the logic design and functional verification step 114, a Hardware Description Language (HDL) design can be created and checked for functional accuracy.

In the synthesis and design step 116, the HDL code can be translated to a netlist, which can be optimized for the target technology. Further, tests can be designed and implemented to check the finished chips. In the netlist verification step 118, the netlist can be checked for compliance with timing constraints and for correspondence with the HDL code.

In the design planning step 120, an overall floor plan for the chip can be constructed and analyzed for timing and top-level routing. Next, in the physical implementation step 122, placement and routing can be performed.

In the analysis and extraction step 124, the circuit functionality can be verified at a transistor level. In the physical verification step 126, the design can be checked to correct any functional, manufacturing, electrical, or lithographic issues.

In the resolution enhancement step 128, geometric manipulations can be performed on the layout to improve manufacturability of the design. Finally, in the mask data preparation step 130, the design can be taped-out 140 for production of masks to produce finished chips.

Simulation and Verification

Figure 2:
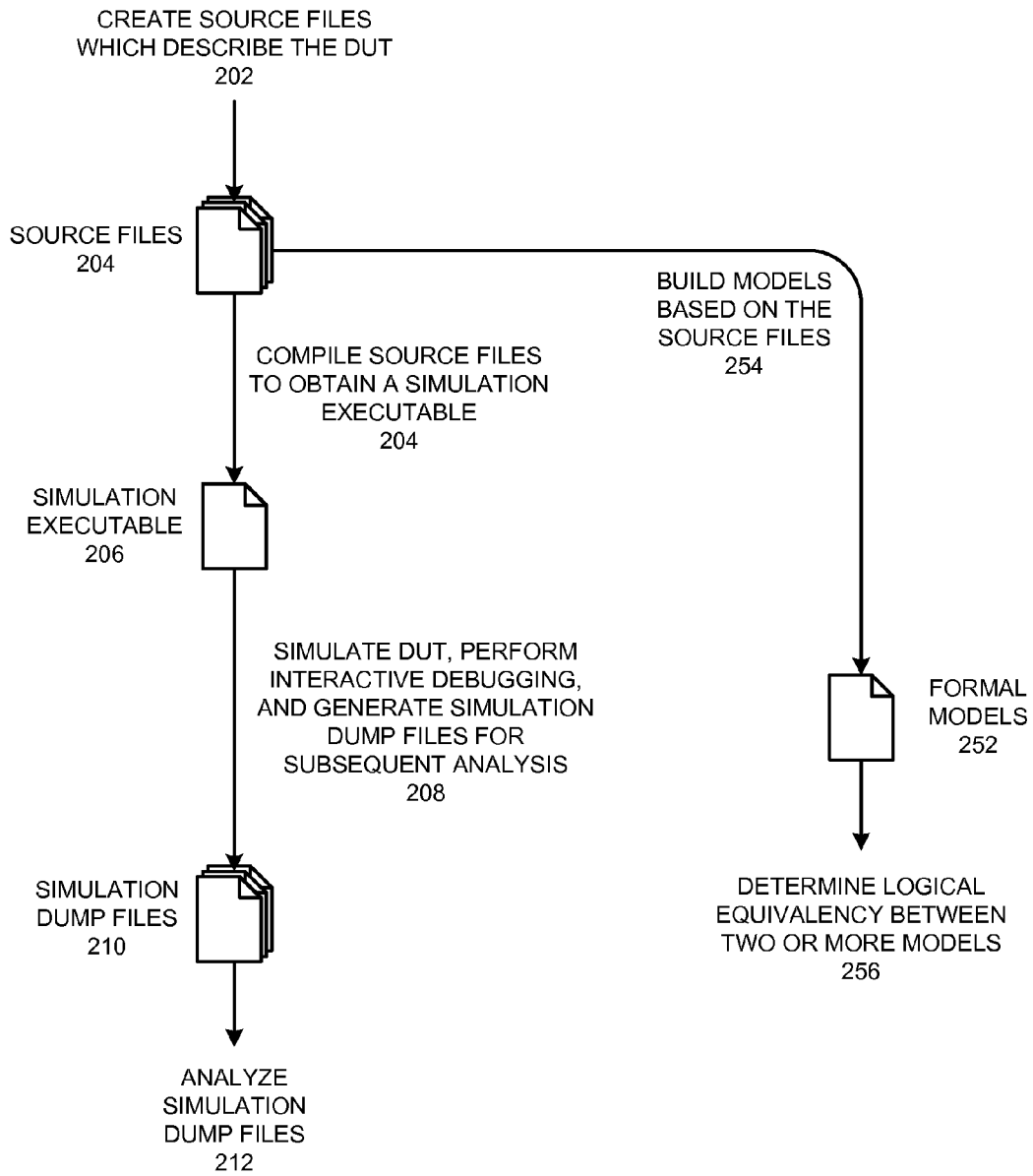
FIG. 2 illustrates a workflow for a simulation and verification solution in accordance with some embodiments disclosed in this disclosure.

FIG. 2 illustrates a workflow for a simulation and a verification solution in accordance with some embodiments disclosed in this disclosure.

The process can begin by creating source files 204 that describe the design under test (DUT) (step 202). Source files 204 may describe the DUT at the gate-level and/or the register transfer level.

Next, a compiler can be used to compile the source files to obtain a simulation executable 206 (step 204). Simulation executable 206 can be a software application which when executed simulates the behavior of the DUT. The simulation executable can also include instructions to perform verification of the DUT during simulation. For example, the compiler can be configured so that it generates instructions for checking the functionality of different parts of the DUT during simulation.

The simulation executable can then be executed to simulate the DUT, perform interactive debugging, and simulation dump files 210 may be generated for subsequent analysis (step 208). Simulation dump files 210 typically contain information about how signal values changed during simulation. Next, the simulation dump files may be analyzed (step 212) to debug the DUT.

During verification, one or more formal models 252 may be built using source files 204 (step 254). Next, a formal verification tool can be used to determine logical equivalency between two or more models (step 256).

The workflow shown in FIG. 2 is for illustrative purposes only and is not intended to limit the scope of the embodiments disclosed in this disclosure. A number of variations will be apparent to practitioners skilled in the art. For example, the system can use a pre-compiler to modify the source files, and then compile the modified source files. Alternatively, the system can use interpretive simulators which typically do not need a compilation step in their workflow.

Note that compiler-based approaches usually simulate faster and use less memory than interpreter-based approaches because a compiler-based approach avoids the extra layers and inefficiency of an interpreter-based approach. The time required to compile source files can be reduced substantially by using incremental compilation which reuses compiled modules unless the associated source files were updated since the last compilation.

Register Transfer Level Simulation and Gate-Level Simulation

A DUT can be simulated at different levels of abstraction. For example, a hardware description language (HDL) can be used to describe a design at the register transfer level (RTL). At this level, the DUT's behavior is defined in terms of registers which store signal values, and combinational logic which performs logical operations on signal values. A DUT can also be described at a gate level which is a lower level of abstraction than the register transfer level. At the gate level, a DUT is represented as a network of logic gates, which is often referred to as a netlist.

The early stages of a design flow usually describe a design at a high level of abstraction, and subsequent stages describe the design at progressively lower levels of abstraction. For example, an RTL design can be synthesized to generate a gate-level design.

To reduce design time, it is desirable to accurately identify errors as early as possible in the design flow. If an error is identified at a later stage, it can substantially increase the design time because a number of stages in the design flow will most likely have to be repeated for the debugged design.

Specifically, it is desirable for the simulations at different levels of abstraction to be as close as possible to the actual behavior of the DUT, and for the simulations to match each other. For example, if a DUT does not produce any errors during an RTL simulation, but produces errors during a gate-level simulation, a circuit designer may either ignore the discrepancy or may need to manually check the discrepancy. Ignoring discrepancies can be risky, and manually checking discrepancies can add costs and delays to the project. Therefore, it is desirable for the simulations to match each other in addition to closely matching the actual behavior of the DUT.

Indeterminate Values and Power-Up Modeling

Circuit design methodologies allow a user to indicate that a signal's value is indeterminate. An indeterminate value can be interpreted as a "don't care" value. For example, a simulation tool can assign a special value (e.g., a value that is different from a 0 or a 1) to a variable which indicates that the variable's value is indeterminate. During synthesis, the system can exploit variables with indeterminate values to determine an optimized logic circuit that uses the least number of gates.

For example, in Verilog, the symbol "X" can be used to indicate an unknown bit in a variable, which can be used to indicate that a variable's value belongs to a set of values. The value 1'bX indicates a one bit unknown value which can be either 1'b0 or 1'b1. The value 2'b1X indicates a two bit value whose most significant bit is equal to 1, and whose least significant bit has an unknown value. Hence, the value 2'b1X can either be 2'b10 or 2'b11. Similarly, the value 2'bXX can be one of four possible values, namely, 2'b00, 2'b01, 2'b10, "2'b11. A variable has an "indeterminate" value if the variable's value can be two or more values.

Modeling the behavior of a circuit during power-up poses a very important verification problem, since the signal values during power-up are usually indeterminate. Accurately modeling power-up behavior can be especially important for complex low-power circuits, because these circuits typically operate at low voltages; hence, a small difference in a signal's voltage can change whether the signal is interpreted as a 0 or a 1, which increases the amount of uncertainty in the power-up signal values. With increasing complexity, the possibility of having explicit or implicit assumptions about power-up signal values also increases, which increases the possibility that the power-up signal values will violate these assumptions.

Conventional simulation techniques determine the output value of a gate based on the input values of the gate. If one or more of the input values is indeterminate, the simulator may conclude that the output value of the gate is also indeterminate. As the simulation progresses, these indeterminate values are propagated on a gate-by-gate basis to the outputs of a combinational block. Conventional gate-level simulators can be pessimistic with respect to propagating indeterminate values because a simulator can end up with more indeterminate values at the outputs of the combinational block than would actually occur during the operation of the circuit.

Specifically, if there are reconvergent paths in the combinational block, the signal values in the reconvergent paths may be correlated. This correlation may cause the output of a gate to be deterministic even if one or more inputs of the gate may have indeterminate values.

Conventional gate-level simulators may exhibit X-pessimism (i.e., pessimism with respect to propagating indeterminate values) while simulating combinational blocks with such reconvergent paths because these simulators cannot account for the correlations between reconvergent paths.

Similarly, conventional verification techniques interpret indeterminate values in a manner that is consistent with the gate-level simulation semantics. Therefore, conventional verification techniques also exhibit X-pessimism when performing formal verification on gate-level designs.

Figures 3A, 3B:
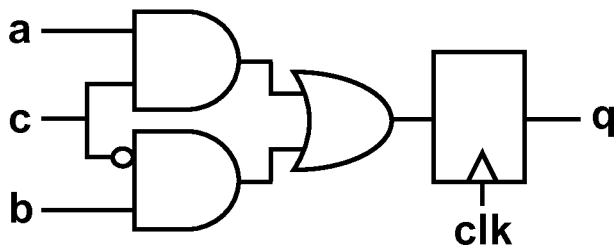
FIGS. 3A and 3B illustrate X-pessimism during gate-level simulation.

FIGS. 3A and 3B illustrate X-pessimism during gate-level simulation. RTL design 300 shown in FIG. 3A corresponds to gate-level design 302 shown in FIG. 3B.

In the designs shown in FIGS. 3A and 3B, if a=1 and b=1, then the output of the OR gate will be equal to 1 regardless of the value of c, and therefore q will also be equal to 1 after the clock edge. In other words, an actual circuit implementation of gate-level design 302 would behave as follows: for inputs a=1, b=1, c=1'bX, the output q=1.

The RTL simulation may match this behavior because when c=1'bX, the simulator may execute either the "if" branch or the "else" branch, and in both cases the RTL simulator will assign the value 1 to q. Some RTL simulators may execute both the "if" branch and the "else" branch and merge the results. In this case also, the RTL simulator will assign the value 1 to q.

However, a conventional gate-level simulator will exhibit X-pessimism and assign the value 1'bX to q. This is because a conventional gate-level simulator will first propagate the signal through the two AND gates, and then propagate the signal through the OR gate. Since a=1, b=1, and c=1'bX, the outputs of the two AND gates are indeterminate, i.e., they will be assigned the value 1'bX. Next, the output of the OR gate will also be assigned the value 1'bX because both of its inputs are equal to 1'bX. Finally, at the clock edge, the conventional gate-level simulator will assign the value 1'bX to q.

Note that, as shown in FIG. 3B, input c splits into two paths which then reconverge to produce output q. A conventional gate-level simulator exhibits X-pessimism because it does not take into account the correlation between the values of these two recovergent paths. Some embodiments described in this disclosure provide methods and apparatuses for reducing X-pessimism during gate-level simulation.

Reducing X-Pessimism in Gate-Level Simulation

Some embodiments modify the gate-level design to reduce X-pessimism during gate-level simulation. Specifically, the system can receive a gate-level design. A gate-level design can generally include a network of combinational and sequential circuit elements. Next, the system can identify combinational blocks in the gate-level design that are expected to exhibit X-pessimism during gate-level simulation. According to one definition, a combinational block is a subset of a gate-level design that includes combinational circuit elements, e.g., logic gates, but does not include sequential circuit elements, e.g., latches. The system can then add one or more additional blocks to the gate-level design. Note that the additional blocks do not change the functional behavior of the circuit. Instead, the additional blocks are designed to reduce X-pessimism during gate-level simulation by accounting for correlations between reconvergent paths.

In some embodiments, some of the additional blocks replicate a combinational block that is expected to exhibit X-pessimism during gate-level simulation. Each input of interest that has an indeterminate value is assigned a concrete value (e.g., a 0 or a 1) in each replica. Corresponding outputs from the replicas are then merged. Specifically, if the corresponding outputs from the replicas have the same value, then that value is assigned to the output instead of assigning an indeterminate value to the output. In this manner, some embodiments can reduce X-pessimism during gate-level simulation.

Figure 4A:
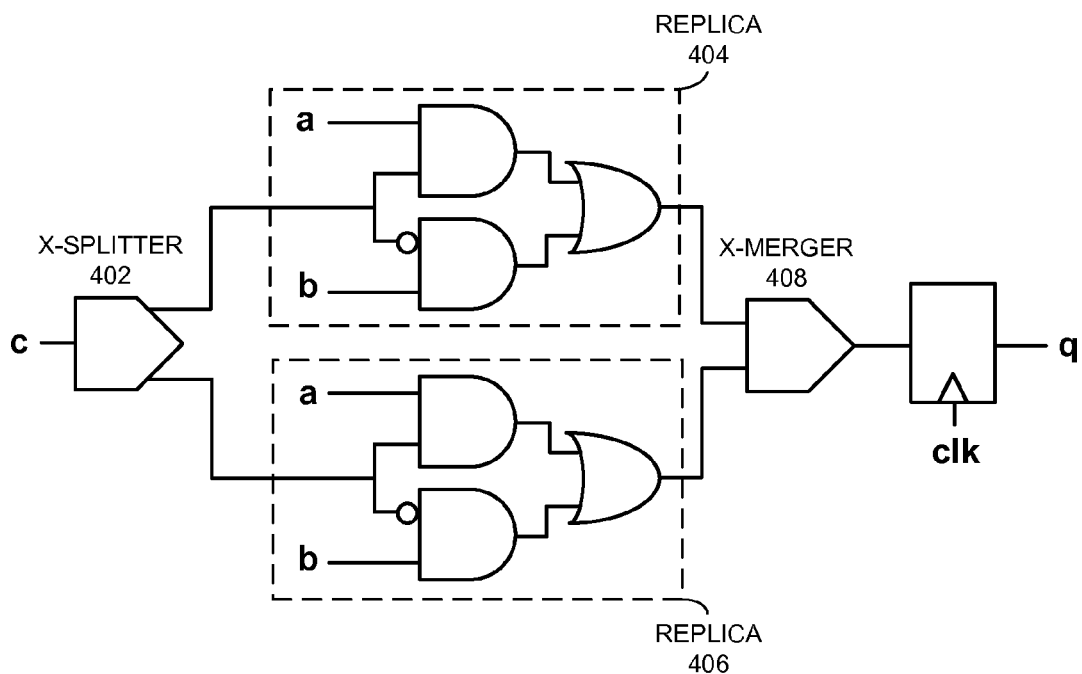
FIG. 4A illustrates how X-pessimism can be reduced during gate-level simulation in accordance with some embodiments described in this disclosure.

FIG. 4A illustrates how X-pessimism can be reduced during gate-level simulation in accordance with some embodiments described in this disclosure.

To reduce (or eliminate) X-pessimism while simulating gate-level design 302, some embodiments can create replicas 404 and 406 of gate-level design 302. Input c in gate-level design 302 can be provided as input to X-splitter 402. One of the outputs of X-splitter 402 can be provided as "input c" to replica 404, and the other output can be provided as "input c" to replica 406. The outputs from the OR gates in replicas 404 and 406 can be provided as inputs to X-merger 408. The output of X-merger 408 can then be provided as input to the latch.

Figure 4B:
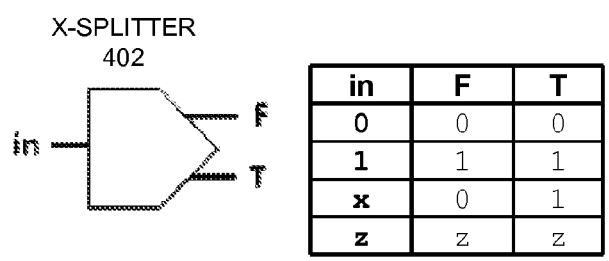
FIG. 4B illustrates a truth table for an X-splitter in accordance with some embodiments described in this disclosure.

FIG. 4B illustrates a truth table for an X-splitter in accordance with some embodiments described in this disclosure.

As shown in FIG. 4B, when the input value is indeterminate, X-splitter 402 outputs different values in its two outputs. In this manner, replicas 404 and 406 simulate, in parallel, the two possible values—0 and 1—for the indeterminate input value.

Figure 4C:
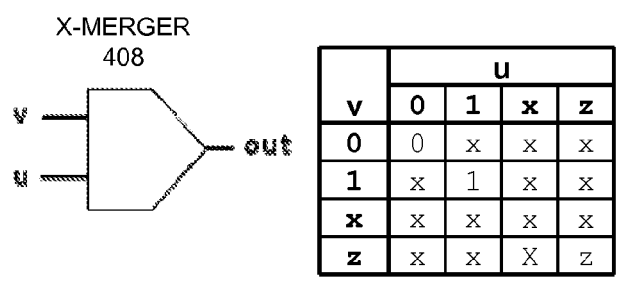
FIG. 4C illustrates a truth table for an X-merger in accordance with some embodiments described in this disclosure.

FIG. 4C illustrates a truth table for an X-merger in accordance with some embodiments described in this disclosure.

As shown in FIG. 4C, when the input values are different, X-merger 408 outputs an indeterminate value. In other words, in the gate-level design shown in FIG. 4A, the output value of X-merger 408 is indeterminate only when the output values from replicas 404 and 406 are different. If the output values from replicas 404 and 406 are the same, X-merger 408 will output the same value, thereby reducing X-pessimism. Note that "z" refers to a high-impedance state in both FIGS. 4B and 4C.

Figure 5A:
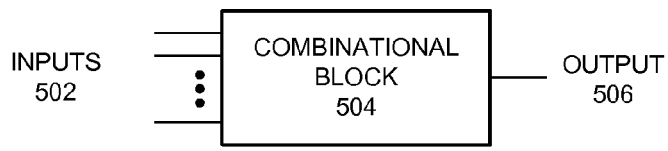
FIG. 5A illustrates a combinational block in accordance with some embodiments described in this disclosure.

FIG. 5A illustrates a combinational block in accordance with some embodiments described in this disclosure.

Combinational block 504 can generally include any network of combinational logic gates, e.g., AND, OR, NAND, NOR, XOR, etc. The value of output 506 of combinational block 504 is based on the values of inputs 502. Combinational block 504 can be represented by a Boolean expression such that each variable in the Boolean expression corresponds to an input from inputs 502, and the value of the Boolean expression can correspond to the value of output 506. In some embodiments, the system can analyze the Boolean expression to determine whether or not the combinational block 504 is expected to exhibit X-pessimism.

Combinational block 504 may or may not exhibit X-pessimism during gate-level simulation. If combinational block 504 is not expected to exhibit X-pessimism, no additional blocks may be required. However, if combinational block 504 is expected to exhibit X-pessimism during gate-level simulation, additional blocks may be added to reduce X-pessimism as explained below.

Figure 5B:
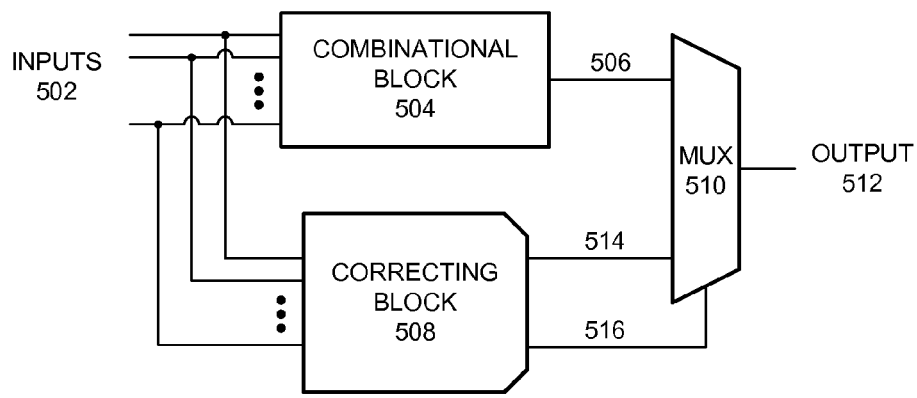
FIG. 5B illustrates how X-pessimism can be reduced by adding a correcting block in accordance with some embodiments described in this disclosure.

FIG. 5B illustrates how X-pessimism can be reduced by adding a correcting block in accordance with some embodiments described in this disclosure.

Some embodiments add correcting block 508 to the gate-level design to reduce X-pessimism. Specifically, some or all of the inputs 502 can be provided as inputs to correcting block 508. Output 506 from combinational block 504 and output 514 from correcting block 508 can be provided as input to multiplexer 510, and output 516 from correcting block 508 can be provided as the select signal to multiplexer 510. Finally, output 512 of multiplexer 516 can be treated as the output of combinational block 504, e.g., any inputs in the gate-level design that were coupled to output 506 can now be coupled to output 512.

Correcting block 508 can generally include any network of logic gates. In general, when inputs 502 cause combinational block 504 to exhibit X-pessimism, correcting block 508 produces the corresponding non-X-pessimistic output value, e.g., the value that an actual circuit would produce. Multiplexer 510 selects the appropriate output depending on whether or not combinational block 504 is expected to exhibit X-pessimism. Specifically, when inputs 502 do not cause combinational block 504 to exhibit X-pessimism, multiplexer 510 can select output 506 of combinational block 504. On the other hand, when inputs 502 cause combinational block 504 to exhibit X-pessimism, multiplexer 510 can select output 514 of correcting block 508.

In some embodiments, correcting block 508 can be implemented as a sparse table. Inputs 502 can be used to look up an entry in the sparse table. The sparse table can store entries that correspond to the non-X-pessimism output of combinational block 504. If a table entry is found, the value stored in the table entry can be outputted as output 514, and output 516 can be used to select output 514 in multiplexer 510. On the other hand, if a table entry is not found, output 516 can be used to select output 506 in multiplexer 510.

For example, the sparse table for gate-level design 302 may contain only one entry that corresponds to the input values a=1, b=1, c=1'bX. The value stored in the sparse table entry can be 1, which corresponds to the value that q would have in an actual circuit.

Figure 6:
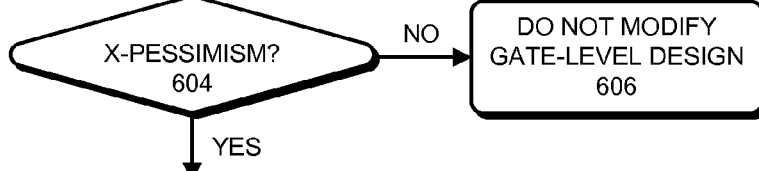
FIG. 6 presents a flowchart that illustrates a process for reducing X-pessimism during gate-level simulation in accordance with some embodiments described in this disclosure.

FIG. 6 presents a flowchart that illustrates a process for reducing X-pessimism during gate-level simulation in accordance with some embodiments described in this disclosure.

A system can begin the process by identifying reconvergent inputs of a combinational block in a gate-level design (operation 602). If a combinational block does not have any reconvergent inputs, the system may determine that the combinational block is not expected to exhibit X-pessimism. However, if a combinational block has reconvergent inputs, the system can then determine whether or not the combinational block is expected to exhibit X-pessimism (operation 604). If the combinational block is not expected to exhibit X-pessimism ("NO" branch), the system does not modify the gate-level design (operation 606). On the other hand, if the combinational block is expected to exhibit X-pessimism, ("YES" branch), the system can modify the gate-level design by: adding one or more replicas of the combinational block, adding one or more X-splitter blocks to couple each reconvergent input that is capable of having an indeterminate value to corresponding inputs of the one or more replicas, and adding one or more X-merger blocks to merge corresponding outputs from the replicas (operation 608).

Note that replicating a combinational block in the gate-level design may not significantly increase the simulation run-time if the replicas are simulated simultaneously.

Figure 7:
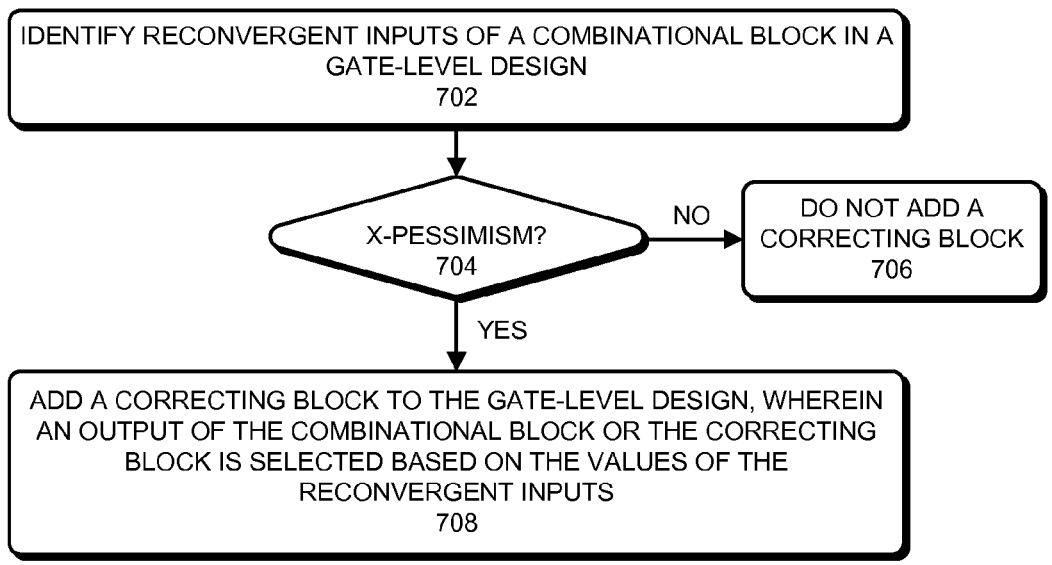
FIG. 7 presents a flowchart that illustrates a process for reducing X-pessimism during gate-level simulation in accordance with some embodiments described in this disclosure.

FIG. 7 presents a flowchart that illustrates a process for reducing X-pessimism during gate-level simulation in accordance with some embodiments described in this disclosure.

A system can begin the process by identifying reconvergent inputs of a combinational block in a gate-level design (operation 702). According to one definition, a reconvergent input is an input that has two or more different signal paths to the same output. For example, "input c" in FIG. 3B is a reconvergent input because there are two different paths from "input c" to "output q." Note that the two or more different signal paths may have common segments. For example, the two signal paths from "input c" to "output q" in FIG. 3B share the segment from the output of the OR gate to "output q."

Next, the system can determine whether or not the combinational block is expected to exhibit X-pessimism (operation 704).

In some embodiments, the system can simulate a combinational block with different input values to determine whether or not the combinational block exhibits X-pessimism. In some embodiments, the system can receive user input which identifies one or more combinational blocks that are expected to exhibit X-pessimism during gate-level simulation. The user input may also specify the reconvergent inputs and their values for which the combinational block exhibits X-pessimism. If the reconvergent inputs are not specified and/or if the values of the reconvergent inputs are not specified by the user, the system can determine them via simulation.

In some embodiments, the system can represent the combinational block using a Boolean expression, and analyze the Boolean expression to determine whether or not the combinational block is expected to exhibit X-pessimism during gate-level simulation.

If the combinational block is not expected to exhibit X-pessimism ("NO" branch), the system does not add a correcting block (operation 706). On the other hand, if the combinational block is expected to exhibit X-pessimism, ("YES" branch), the system can add a correcting block to the gate-level design, wherein an output of the combinational block or the correcting block is selected based on the values of the reconvergent inputs (operation 708).

In some embodiments, the system can add the correcting block during compilation of the gate-level design to obtain a corrected object code. The system can then simulate the gate-level design without X-pessimism by executing the corrected object code.

In some embodiments, the system can add the correcting block during pre-compilation of the gate-level design to obtain a corrected gate-level design. Next, the system can compile the corrected gate-level design to obtain a corrected object code, and then simulate the gate-level design without X-pessimism by executing the corrected object code.

Reducing X-Pessimism in Formal Verification

Some embodiments described in this disclosure provide methods and apparatuses for reducing X-pessimism during formal verification of a gate-level design. Specifically, formal verification of a gate-level design may involve (1) determining logical equivalence between the gate-level design and a corresponding register-transfer level design, and/or (2) determining logical equivalence between the gate-level design and another gate-level design.

In formal verification, a system usually creates one or more models for the circuit designs, and then uses the one or more models to determine whether or not the circuit designs are logically equivalent. Specifically, in some embodiments, the system can represent each primary input of a design with a unique free input variable. Next, the system can build a model for the design by representing the outputs of each gate as a function of the inputs as the system traverses the design from the inputs to the outputs. Once the model for the entire design has been built, the system can then use the model to perform formal verification.

Some conventional gate-level formal verification techniques treat indeterminate values pessimistically. Just as in gate-level simulation, it is desirable to reduce X-pessimism in formal verification in order to maintain consistency with hardware behavior.

Some embodiments described in this disclosure reduce X-pessimism by modifying the process by which a model is built for a design. The resulting model (which includes features that reduce X-pessimism) can then be used by formal verification techniques.

Figure 8:
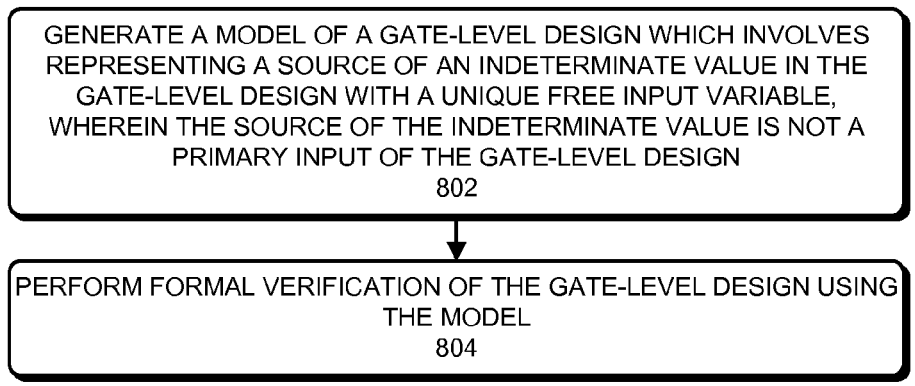
FIG. 8 presents a flowchart that illustrates a process for reducing X-pessimism during formal verification in accordance with some embodiments described in this disclosure.

FIG. 8 presents a flowchart that illustrates a process for reducing X-pessimism during formal verification in accordance with some embodiments described in this disclosure.

The process can begin with a system generating a model of a gate-level design which involves representing a source of an indeterminate value in the gate-level design with a unique free input variable, wherein the source of the indeterminate value is not a primary input of the gate-level design (operation 802). In some embodiments, the system can create a unique free input variable for each reconvergent input that is expected to have an indeterminate value. According to one definition, a primary input of a gate-level design is an input that is capable of receiving a signal from a source that is external to the gate-level design. For example, in FIG. 5A, inputs 502 are primary inputs of combinational block 504.

Next, the system can perform formal verification of the gate-level design using the model (operation 804).

Figure 9:
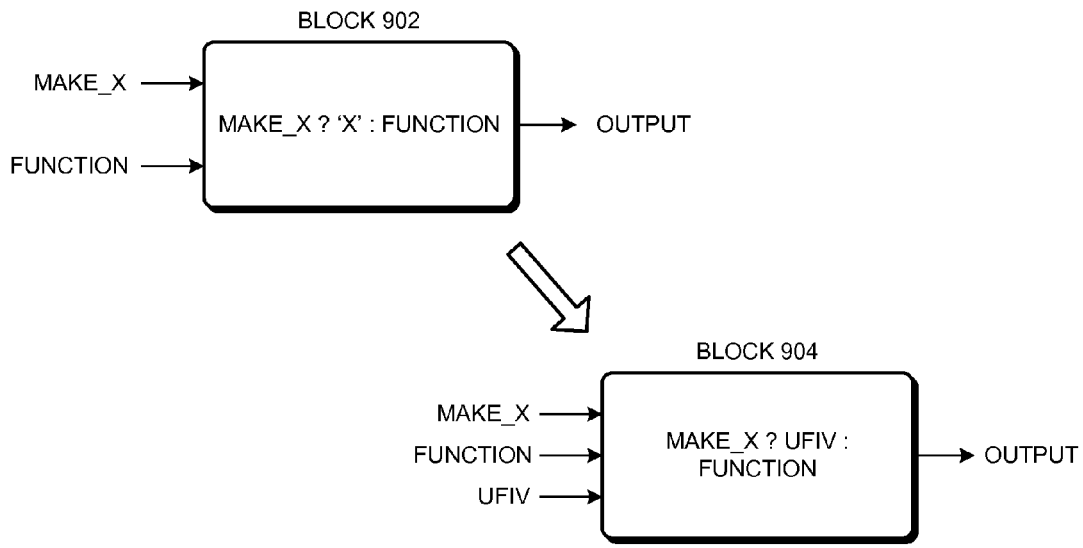
FIG. 9 illustrates how a source of an indeterminate value in a gate-level design can be represented with a unique free input variable in accordance with some embodiments described in this disclosure.

FIG. 9 illustrates how a source of an indeterminate value in a gate-level design can be represented with a unique free input variable in accordance with some embodiments described in this disclosure.

Block 902 can represent a step in a conventional process for building a model for a design. The symbol "FUNCTION" refers to a functional representation of a portion of a design (hereinafter "P1"). For example, "a^b" is an example of a functional representation of an AND gate with two inputs "a" and "b." The symbol "MAKE_X" refers to a value that indicates whether or not an indeterminate value (i.e., an "X" value) should be propagated to the portion of the design that receives the output from P1. For example, in some embodiments, if "MAKE_X" is true, then the step represented by block 902 in the model building process propagates an "X". On the other hand, if "MAKE_X" is false, then the step propagates "FUNCTION". This logic is represented by the conditional statement "MAKE_X ? 'X': FUNCTION" in block 902.

The value of "MAKE_X" can be determined based on whether or not an "X" value is to be introduced into the circuit on this net. For example, consider the following HDL code that outputs either "X" or "FUNCTION" depending on the value of the expression "condition":

if (condition) then
    net <=1'bX;
else
    net <=FUNCTION;

In this case, "MAKE_X" will be "condition."

Block 904 can represent a step in a process for building a model for a design in accordance with some embodiments described in this disclosure. The model that is built using this process reduces X-pessimism. As before, the symbol "FUNCTION" refers to a functional representation of a portion of a design, and the symbol "MAKE_X" refers to a value that indicates whether or not an indeterminate value (i.e., an "X" value) should be propagated. The symbol "UFIV" refers to a unique free input variable. Note that this unique free input variable does not correspond to a primary input of the circuit design.

In contrast to conventional model building techniques, some embodiments described in this disclosure propagate a unique free input variable instead of propagating an indeterminate value. Specifically, in some embodiments, if "MAKE_X" is true, then the step represented by block 904 in the model building process propagates "UFIV". On the other hand, if "MAKE_X" is false, then the step propagates "FUNCTION". This logic is represented by the conditional statement "MAKE_X ? UFIV: FUNCTION" in block 904.

Note that each unique free input variable can be viewed as representing a reconvergent input. The unique free input variable enables the system to keep track of correlations between the signal values of multiple recovergent paths because the unique free input variable is simultaneously propagated through the gate-level design along the multiple reconvergent paths. Specifically, the unique free input variables enable the system to reduce X-pessimism by allowing the system to determine when the signal values of multiple reconvergent paths "cancel out" each other.

Figure 10A:
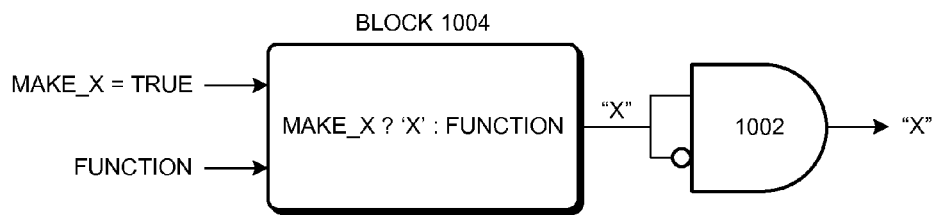
FIGS. 10A and 10B illustrate how unique free input variables can reduce X-pessimism in accordance with some embodiments described in this disclosure.
Figure 10B:
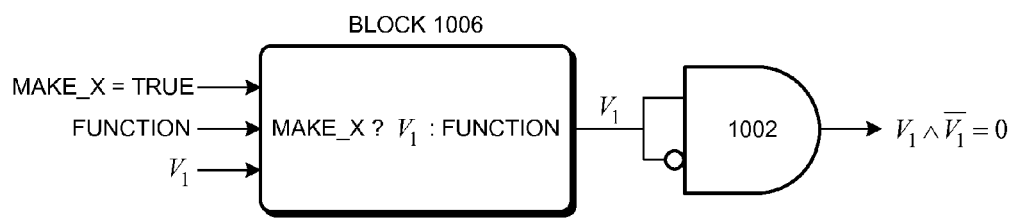

FIGS. 10A and 10B illustrate how unique free input variables can reduce X-pessimism in accordance with some embodiments described in this disclosure.

FIG. 10A illustrates a portion of a gate-level design in which the output of block 1004 (which is similar to block 902) and its inverse are provided as inputs to AND gate 1002. If "MAKE_X" is true, then the output of block 1004 is "X." This causes both of the inputs of AND gate 1002 to be "X," which, in turn, causes the output of AND gate 1002 to be "X." Note that this behavior is not consistent with hardware.

However, some embodiments of gate-level simulators that are described in this disclosure do not suffer from such X-pessimism. In these gate-level simulators, the output of AND gate 1002 will be "0" because one of the two inputs of AND gate 1002 will always be "0." Note that this behavior is consistent with hardware.

FIG. 10B illustrates how using a unique free input variable can reduce X-pessimism during formal verification. In contrast to block 1004, block 1006 (which is similar to block 904) outputs unique free input variable V1. When the system creates a model for AND gate 1002 using free input variable V1, it inherently takes into account the correlation between the values of the two inputs. For example, the system may create a model for the portion of the gate-level design shown in FIG. 10B as follows: $V_1 \wedge \overline{V}_1 = 0$. Note that this model is consistent with the hardware.

Figure 11:
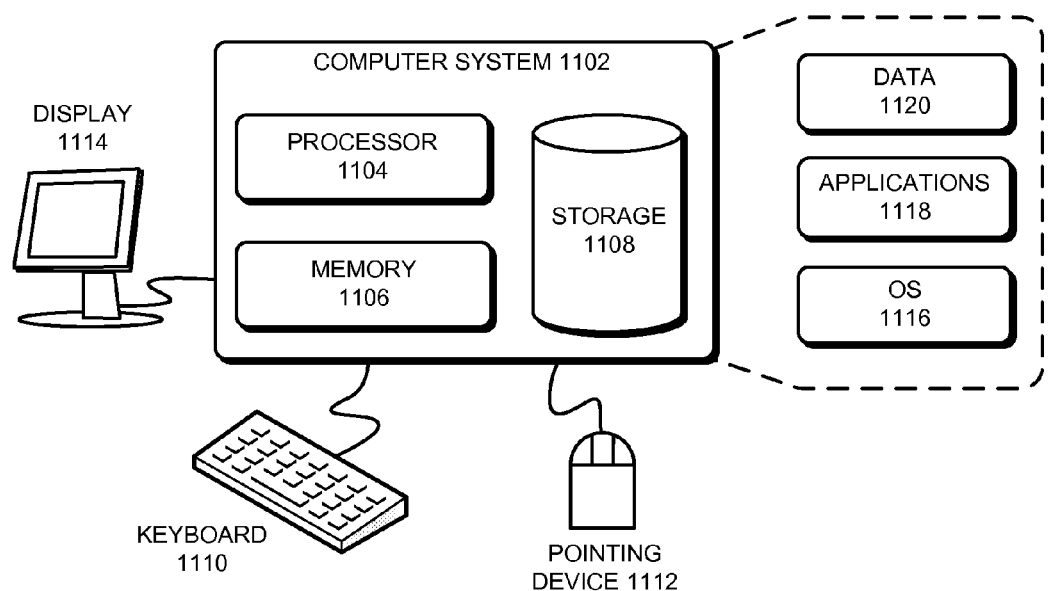
FIG. 11 illustrates a computer system in accordance with some embodiments described in this disclosure.

FIG. 11 illustrates a computer system in accordance with some embodiments described in this disclosure. A computer system generally refers to any device that is capable of performing computations.

A computer system can be used to simulate, compile, or modify a gate-level design. A computer system can also be used to create a model for a gate-level design, and then use the model during formal verification.

Computer system 1102 can include processor 1104, memory 1106, and storage device 1108. Computer system 1102 can be coupled to display device 1114, keyboard 1110, and pointing device 1112. Storage device 1108 can store operating system 1116, applications 1118, and data 1120.

Data 1120 can include a gate-level design, a corrected gate-level design, and/or a model for a gate-level design. Applications 1118 can include a pre-compiler, a compiler, a simulation executable, an interpreter, and/or tools required for creating and verifying formal models of circuit designs.

In some embodiments, a user can use a compiler to generate a simulation executable which includes additional blocks to reduce or eliminate X-pessimism. When the simulation executable is executed by computer system 1102, it can cause computer system 1102 to simulate the gate-level design without exhibiting X-pessimism. Alternatively, a user can provide the gate-level design to an interpreter, which adds additional blocks as necessary to the gate-level design to reduce X-pessimism and simulates the corrected gate-level design without exhibiting X-pessimism.

In some embodiments, a user can use a pre-compiler to modify a gate-level design to generate a corrected gate-level design. The corrected gate-level design can then be compiled using a compiler to generate a simulation executable. When the simulation executable is executed by computer system 1102, it can cause computer system 1102 to simulate the gate-level design without exhibiting X-pessimism. Alternatively, a user can provide the corrected gate-level design to an interpreter to simulate the gate-level design without exhibiting X-pessimism.

In some embodiments, a user can use one or more tools to perform formal verification on a circuit design without exhibiting X-pessimism. Specifically, the system can create a model for a gate-level design by using a unique free input variable for each source of an indeterminate value. Next, the system can use the model in formal verification, e.g., to check logical equivalence between two gate-level designs or to check logical equivalence between a gate-level design and a corresponding register transfer level design.

CONCLUSION

The above description is presented to enable any person skilled in the art to make and use the embodiments. Various modifications to the disclosed embodiments will be readily apparent to those skilled in the art, and the general principles defined herein are applicable to other embodiments and applications without departing from the spirit and scope of the present disclosure. Thus, the claimed embodiments are to be accorded the widest scope consistent with the principles and features disclosed herein.

The data structures and code described in this disclosure can be partially or fully stored on a computer-readable storage medium and/or a hardware module and/or hardware apparatus. A computer-readable storage medium includes, but is not limited to, volatile memory, non-volatile memory, magnetic and optical storage devices such as disk drives, magnetic tape, CDs (compact discs), DVDs (digital versatile discs or digital video discs), or other media, now known or later developed, that are capable of storing code and/or data. Hardware modules or apparatuses described in this disclosure include, but are not limited to, application-specific integrated circuits (ASICs), field-programmable gate arrays (FPGAs), dedicated or shared processors, and/or other hardware modules or apparatuses now known or later developed.

The methods and processes described in this disclosure can be partially or fully embodied as code and/or data stored in a computer-readable storage medium or device, so that when a computer system reads and executes the code and/or data, the computer system performs the associated methods and processes. The methods and processes can also be partially or fully embodied in hardware modules or apparatuses, so that when the hardware modules or apparatuses are activated, they perform the associated methods and processes. Note that the methods and processes can be embodied using a combination of code, data, and hardware modules or apparatuses.

The foregoing descriptions of embodiments have been presented only for purposes of illustration and description. They are not intended to be exhaustive or to limit the claimed embodiments to the forms disclosed. Accordingly, many modifications and variations will be apparent to practitioners skilled in the art. Additionally, the above disclosure is not intended to limit the claimed embodiments. The scope of claimed embodiments is defined by the appended claims.

What is claimed is:

1. A method for reducing X-pessimism, the method comprising:
    identifying a set of reconvergent inputs of a combinational block in a gate-level design; and in response to determining that the combinational block is expected to exhibit X-pessimism during gate-level simulation, adding, by computer, a correcting block to the gate-level design, wherein an output of the combinational block or the correcting block is selected based on the values of the set of reconvergent inputs.

2. The method of claim 1, wherein identifying the set of reconvergent inputs includes identifying at least two distinct paths between a first input and a first output of the combinational block.

3. The method of claim 1, wherein determining that the combinational block is expected to exhibit X-pessimism during gate-level simulation includes simulating the combinational block with indeterminate values.

4. The method of claim 1, wherein determining that the combinational block is expected to exhibit X-pessimism during gate-level simulation includes receiving user input which identifies one or more combinational blocks that are expected to exhibit X-pessimism during gate-level simulation.

5. The method of claim 1, wherein adding the correcting block to the gate-level design includes adding the correcting block during compilation of the gate-level design to obtain a corrected object code.

6. The method of claim 5, wherein the method further comprises simulating the gate-level design by executing the corrected object code.

7. The method of claim 1, wherein adding the correcting block to the gate-level design includes:
adding the correcting block during pre-compilation of the gate-level design to obtain a corrected gate-level design; and
compiling the corrected gate-level design to obtain a corrected object code.

8. The method of claim 7, wherein the method further comprises simulating the gate-level design by executing the corrected object code.

9. A non-transitory computer-readable storage medium storing instructions that, when executed by a computer, cause the computer to perform a method for reducing X-pessimism, the method comprising:
identifying a set of reconvergent inputs of a combinational block in a gate-level design; and
in response to determining that the combinational block is expected to exhibit X-pessimism during gate-level simulation, adding a correcting block to the gate-level design, wherein an output of the combinational block or the correcting block is selected based on the values of the set of reconvergent inputs.

10. The non-transitory computer-readable storage medium of claim 9, wherein determining that the combinational block is expected to exhibit X-pessimism during gate-level simulation includes simulating the combinational block with indeterminate values.

11. The non-transitory computer-readable storage medium of claim 9, wherein determining that the combinational block is expected to exhibit X-pessimism during gate-level simulation includes receiving user input which identifies one or more combinational blocks that are expected to exhibit X-pessimism during gate-level simulation.

12. The non-transitory computer-readable storage medium of claim 9, wherein determining that the combinational block is expected to exhibit X-pessimism during gate-level simulation includes:
representing the combinational block using a Boolean expression; and
analyzing the Boolean expression to determine whether or not the combinational block is expected to exhibit X-pessimism during gate-level simulation.

13. The non-transitory computer-readable storage medium of claim 9, wherein adding the correcting block to the gate-level design includes adding the correcting block during compilation of the gate-level design to obtain a corrected object code.

14. The non-transitory computer-readable storage medium of claim 13, wherein the method further comprises simulating the gate-level design by executing the corrected object code.

15. The non-transitory computer-readable storage medium of claim 9, wherein adding the correcting block to the gate-level design includes:
adding the correcting block during pre-compilation of the gate-level design to obtain a corrected gate-level design; and
compiling the corrected gate-level design to obtain a corrected object code.

16. The non-transitory computer-readable storage medium of claim 15, wherein the method further comprises simulating the gate-level design by executing the corrected object code.

17. A system, comprising:
a processor; and
a non-transitory computer-readable storage medium storing instructions that, when executed by the processor, cause the system to perform a method for reducing X-pessimism, the method comprising:
identifying a set of reconvergent inputs of a combinational block in a gate-level design; and
in response to determining that the combinational block is expected to exhibit X-pessimism during gate-level simulation, adding a correcting block to the gate-level design, wherein an output of the combinational block or the correcting block is selected based on the values of the set of reconvergent inputs.

18. The system of claim 17, wherein determining that the combinational block is expected to exhibit X-pessimism during gate-level simulation includes simulating the combinational block with indeterminate values.

19. The system of claim 17, wherein determining that the combinational block is expected to exhibit X-pessimism during gate-level simulation includes receiving user input which identifies one or more combinational blocks that are expected to exhibit X-pessimism during gate-level simulation.

20. The system of claim 17, wherein determining that the combinational block is expected to exhibit X-pessimism during gate-level simulation includes:
representing the combinational block using a Boolean expression; and
analyzing the Boolean expression to determine whether or not the combinational block is expected to exhibit X-pessimism during gate-level simulation.

21. A method for reducing X-pessimism, the method comprising:
identifying a set of reconvergent inputs of a combinational block in a gate-level design; and
in response to determining that the combinational block is expected to exhibit X-pessimism during gate-level simulation, modifying, by computer, the gate-level design, wherein said modifying includes:
adding one or more replicas of the combinational block, adding one or more X-splitter blocks to couple each reconvergent input that is capable of having an indeterminate value to corresponding inputs of the one or more replicas, and adding one or more X-merger blocks to merge corresponding outputs from the replicas.

22. A method for reducing X-pessimism, the method comprising:
generating, by computer, a model of a gate-level design, wherein said generating includes representing a source of an indeterminate value in the gate-level design with a unique free input variable, wherein the source of the indeterminate value is not a primary input of the gate-level design; and
performing formal verification of the gate-level design using the model, wherein said performing includes determining logical equivalence between the gate-level design and a corresponding register-transfer level design.

23. The method of claim 21, wherein determining that the combinational block is expected to exhibit X-pessimism during gate-level simulation includes simulating the combinational block with indeterminate values.

24. The method of claim 21, wherein determining that the combinational block is expected to exhibit X-pessimism during gate-level simulation includes receiving user input which identifies one or more combinational blocks that are expected to exhibit X-pessimism during gate-level simulation.

25. The method of claim 21, wherein determining that the combinational block is expected to exhibit X-pessimism during gate-level simulation includes:
representing the combinational block using a Boolean expression; and
analyzing the Boolean expression to determine whether or not the combinational block is expected to exhibit X-pessimism during gate-level simulation.

26. A non-transitory computer-readable storage medium storing instructions that, when executed by a computer, cause the computer to perform a method for reducing X-pessimism, the method comprising:
identifying a set of reconvergent inputs of a combinational block in a gate-level design; and
in response to determining that the combinational block is expected to exhibit X-pessimism during gate-level simulation, modifying the gate-level design, wherein said modifying includes:
adding one or more replicas of the combinational block,
adding one or more X-splitter blocks to couple each reconvergent input that is capable of having an indeterminate value to corresponding inputs of the one or more replicas, and
adding one or more X-merger blocks to merge corresponding outputs from the replicas.

27. The non-transitory computer-readable storage medium of claim 26, wherein determining that the combinational block is expected to exhibit X-pessimism during gate-level simulation includes simulating the combinational block with indeterminate values.

28. The non-transitory computer-readable storage medium of claim 26, wherein determining that the combinational block is expected to exhibit X-pessimism during gate-level simulation includes receiving user input which identifies one or more combinational blocks that are expected to exhibit X-pessimism during gate-level simulation.

29. The non-transitory computer-readable storage medium of claim 26, wherein determining that the combinational block is expected to exhibit X-pessimism during gate-level simulation includes:
representing the combinational block using a Boolean expression; and
analyzing the Boolean expression to determine whether or not the combinational block is expected to exhibit X-pessimism during gate-level simulation.

30. A non-transitory computer-readable storage medium storing instructions that, when executed by a computer, cause the computer to perform a method for reducing X-pessimism, the method comprising:
generating, by computer, a model of a gate-level design, wherein said generating includes representing a source of an indeterminate value in the gate-level design with a unique free input variable, wherein the source of the indeterminate value is not a primary input of the gate-level design; and
performing formal verification of the gate-level design using the model, wherein said performing includes determining logical equivalence between the gate-level design and a corresponding register-transfer level design.

31. A method for reducing X-pessimism, the method comprising:
generating, by computer, a model of a gate-level design, wherein said generating includes representing a source of an indeterminate value in the gate-level design with a unique free input variable, wherein the source of the indeterminate value is not a primary input of the gate-level design; and
performing formal verification of the gate-level design using the model, wherein said performing includes determining logical equivalence between the gate-level design and another gate-level design.

32. A non-transitory computer-readable storage medium storing instructions that, when executed by a computer, cause the computer to perform a method for reducing X-pessimism, the method comprising:
generating, by computer, a model of a gate-level design, wherein said generating includes representing a source of an indeterminate value in the gate-level design with a unique free input variable, wherein the source of the indeterminate value is not a primary input of the gate-level design; and
performing formal verification of the gate-level design using the model, wherein said performing includes determining logical equivalence between the gate-level design and another gate-level design.

* * * * *